US009429794B2

United States Patent
Shen et al.

(10) Patent No.: US 9,429,794 B2
(45) Date of Patent: Aug. 30, 2016

(54) PIXEL UNIT, THIN FILM TRANSISTOR ARRAY SUBSTRATE AND LIQUID CRYSTAL DISPLAY

(71) Applicants: Boe Technology Group Co., Ltd., Beijing (CN); HEFEI Boe Optoelectronics Technology Co., Ltd., Anhui (CN)

(72) Inventors: Ying Shen, Beijing (CN); Zhizhong Tu, Beijing (CN); Rongge Sun, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 224 days.

(21) Appl. No.: 14/078,030

(22) Filed: Nov. 12, 2013

(65) Prior Publication Data

US 2014/0139773 A1    May 22, 2014

(30) Foreign Application Priority Data

Nov. 16, 2012    (CN) .......................... 2012 1 0464940

(51) Int. Cl.
G02F 1/1337    (2006.01)
H01L 27/12    (2006.01)
G02F 1/1343    (2006.01)

(52) U.S. Cl.
CPC ..... G02F 1/133707 (2013.01); H01L 27/1255 (2013.01); *G02F 2001/133757* (2013.01); *G02F 2001/134345* (2013.01); *G02F 2001/134354* (2013.01)

(58) Field of Classification Search
CPC ............. G02F 1/133707; G02F 2001/134354; G02F 2001/133757; G02F 1/136213; G02F 2001/134345; H01L 27/1255

USPC ............................................. 349/38, 39, 144
See application file for complete search history.

(56) References Cited

U.S. PATENT DOCUMENTS 7,474,292 B2 *  1/2009  Kamada et al. ................ 345/90
8,441,590 B2 *  5/2013  Tsubata ............. G02F 1/136286
                                                    349/39

(Continued)

FOREIGN PATENT DOCUMENTS

CN        1677179 A    10/2005
CN        1825419 A    8/2006

(Continued)

OTHER PUBLICATIONS

English translation of Chinese Office Action dated Sep. 28, 2014, for Chinese Application No. 2012104649407.

*Primary Examiner* — Paul Lee
*Assistant Examiner* — Jia Pan
(74) *Attorney, Agent, or Firm* — Kinney & Lange, P.A.

(57) ABSTRACT

A pixel unit includes an active area pixel electrode and a passive area pixel electrode disposed in the same layer; a thin film transistor switch electrically connected to the active area pixel electrode; and a coupling electrode disposed in a different layer from the active area pixel electrode and electrically connected to the active area pixel electrode, wherein the coupling electrode and the passive area pixel electrode are arranged to be at least partly overlapped with each other to form a coupling capacitance. The present invention also discloses an array substrate comprising the pixel unit and a liquid crystal display comprising the array substrate.

10 Claims, 2 Drawing Sheets

(56) References Cited

U.S. PATENT DOCUMENTS

| | | |
|---|---|---|
| 2007/0103607 A1 | 5/2007 | Hanaoka et al. |
| 2008/0225194 A1* | 9/2008 | Harada et al. .................. 349/46 |
| 2011/0012815 A1* | 1/2011 | Tsubata ........................... 345/55 |
| 2011/0205200 A1* | 8/2011 | Tsubata ............. G02F 1/136213 345/206 |
| 2011/0216246 A1* | 9/2011 | Sato .................. H04W 72/0486 348/723 |
| 2012/0001838 A1* | 1/2012 | Tsubata ............. G02F 1/134336 345/87 |
| 2012/0001839 A1* | 1/2012 | Tsubata ........................... 345/90 |
| 2012/0026415 A1* | 2/2012 | Tsubata ............. G02F 1/136213 348/790 |
| 2012/0169577 A1* | 7/2012 | Sun ................................ 345/92 |

FOREIGN PATENT DOCUMENTS

| | | |
|---|---|---|
| CN | 202870440 U | 4/2013 |
| KR | 20060121720 A | 11/2006 |

* cited by examiner

PIXEL UNIT, THIN FILM TRANSISTOR ARRAY SUBSTRATE AND LIQUID CRYSTAL DISPLAY

CROSS-REFERENCE TO RELATED APPLICATION

This application claims the benefit of Chinese Patent Application No. 201210464940.7 filed on Nov. 16, 2012 in the State Intellectual Property Office of China, the whole disclosure of which is incorporated herein by reference.

BACKGROUND OF THE INVENTION

1. Field of the Invention

The present invention relates to a technical field of a liquid crystal display, more particularly, relates to a pixel unit, a thin film transistor array substrate and a liquid crystal display.

2. Description of the Related Art

Currently, a liquid crystal display having an advanced super dimension switch (ADS) mode is widely applied because it has various advantages, such as a wide visual angle, a high transmission, a low chromatic aberration, etc. In the liquid crystal display having the ADS mode, a multi dimensional electric field is formed by an electric field generated at edges of the same layer of slit electrodes and an electric field generated between the layer of slit electrodes and a layer of plate electrode, so that all orientations of liquid crystal molecules among the slit electrodes and above the slit electrodes in a liquid crystal cell are revolved, improving the operation efficiency of the liquid crystal molecules and increasing the light transmission efficiency.

Generally, a thin film transistor (TFT) array substrate of the liquid crystal display having the ADS mode comprises a substrate and pixel units arranged on the substrate in an array. As shown in FIG. 1, each of the pixel units comprises a TFT electrically connected to each of a gate line 10 and a data line 20 on the substrate, and a pixel electrode 30 electrically connected to a source electrode 40 of the TFT through a via 60. Furthermore, the pixel electrode 30 comprises slit electrodes having a certain inclination angle. The TFT array substrate further comprises a common electrode for forming an electric field with the pixel electrode. A deflection angle of liquid crystal molecules is controlled by changing the intensity of electric field generated between the pixel electrode 30 and the common electrode.

When the liquid crystal display having the ADS mode is in operation, the liquid crystal molecules are revolved under a voltage. However, the liquid crystal molecules in each of the pixel units have only the same deflection angle. Since the liquid crystal molecules are anisotropic, the brightness of the liquid crystal display of ADS mode is different from different visual angles. That is, a chromatic aberration is occurred when the liquid crystal display displays a picture, decreasing the quality of the picture displayed on the liquid crystal display. Accordingly, alleviating the chromatic aberration of the picture displayed on the liquid crystal display of the ADS mode and improving the quality of the picture displayed on the liquid crystal display of the ADS mode becomes a technical problem to be solved in this art.

SUMMARY OF THE INVENTION

The present invention has been made to overcome or alleviate at least one aspect of the above mentioned disadvantages.

Accordingly, it is an object of certain embodiments of the present invention to provide a pixel unit, a TFT array substrate and a liquid crystal display for alleviating the chromatic aberration of a picture displayed by the liquid crystal display and improving the quality of the picture displayed by the liquid crystal display.

According to an aspect of the present invention, there is provided a pixel unit, comprising: an active area pixel electrode and a passive area pixel electrode disposed in the same layer; a thin film transistor switch electrically connected to the active area pixel electrode; and a coupling electrode disposed in a different layer from the active area pixel electrode and electrically connected to the active area pixel electrode, wherein the coupling electrode and the passive area pixel electrode are arranged to be at least partly overlapped with each other to form a coupling capacitance.

Furthermore, in the above mentioned pixel unit, the active area pixel electrode and the passive area pixel electrode each comprises a set of slit electrodes symmetrically arranged.

Furthermore, in the above mentioned pixel unit, an angle between an orientation of the slit electrode and an initial orientation of a liquid crystal molecule is in a range of 5 degrees to 20 degrees.

Furthermore, in the above mentioned pixel unit, an angle between an orientation of the slit electrode and an initial orientation of a liquid crystal molecule is in a range of 70 degrees to 85 degrees.

Furthermore, in the above mentioned pixel unit, a ratio of an area of an electrode pattern of the active area pixel electrode to an area of an electrode pattern of the passive area pixel electrode is in a range of 1:1 to 1:9.

Furthermore, in the above mentioned pixel unit, the electrode pattern of the active area pixel electrode is identical with the electrode pattern of the passive area pixel electrode.

According to another aspect of the present invention, there is provided an array substrate, comprising: a substrate; and the above mentioned pixel units arranged on the substrate in an array.

Furthermore, the above mentioned array substrate further comprising: gate lines, data lines and a common electrode formed on the substrate; and a first pixel electrode layer and a second pixel electrode layer located above the first pixel electrode layer and separated from the first pixel electrode layer by an insulation layer, wherein the gate lines and the data lines cross with each other to define sub pixel units, and each of the sub pixel units comprises a thin film transistor; wherein one of the first and second pixel electrode layers is connected to a source electrode of the thin film transistor, and the other is connected to the common electrode; wherein the second pixel electrode layer comprises the active area pixel electrode and the passive area pixel electrode disposed in the same layer.

Furthermore, in the above mentioned array substrate, the coupling electrode in the pixel unit and a gate line or a data line on the substrate are disposed in the same layer.

According to another aspect of the present invention, there is provided a liquid crystal display comprising the above mentioned array substrate.

In the pixel unit of the present invention, the pixel unit comprising: an active area pixel electrode and a passive area pixel electrode disposed in the same layer; a thin film transistor switch electrically connected to the active area pixel electrode; and a coupling electrode disposed in a different layer from the active area pixel electrode and electrically connected to the active area pixel electrode, wherein the coupling electrode and the passive area pixel electrode are arranged to be at least partly overlapped with each other to form a coupling capacitance. That is, a pixel electrode in the pixel unit comprises the active area pixel electrode and the passive area pixel electrode disposed in the same layer; and the coupling electrode in the pixel unit is disposed in a different layer from the pixel electrode. The active area pixel electrode is electrically separated from the passive area pixel electrode and is electrically connected to the coupling electrode, and the coupling electrode is at least partly overlapped with the passive area pixel electrode.

When the liquid crystal display with the TFT array substrate of the above mentioned pixel unit is in operation, once a gate line at a position where the pixel unit is located is open, a data voltage charges the active area pixel electrode through the data line and the TFT, and the liquid crystal molecules corresponding to the active area pixel electrode is deflected under the voltage, and the coupling capacitance formed between the coupling electrode and the passive area pixel electrode provides a voltage for driving the liquid crystal molecules corresponding to the passive area pixel electrode. Since the voltage on the passive area pixel electrode is applied by the coupling capacitance, and the voltage applied on the passive area pixel electrode is deferred with respect to the voltage applied on the active area pixel electrode by a certain time. As a result, the liquid crystal molecules corresponding to each of the pixel units have two different deflection angles. In this way, the brightness difference of the liquid crystal display at different angles of view is reduced due to an even effect of the liquid crystal orientation. Thereby, compared with the prior art, the present invention alleviates the chromatic aberration of a picture displayed by the liquid crystal display and improves the quality of the picture displayed by the liquid crystal display.

BRIEF DESCRIPTION OF THE DRAWINGS

The above and other features of the present invention will become more apparent by describing in detail exemplary embodiments thereof with reference to the accompanying drawings, in which.

LIST OF REFERENCE NUMERALS OF DRAWINGS

Figure 1:
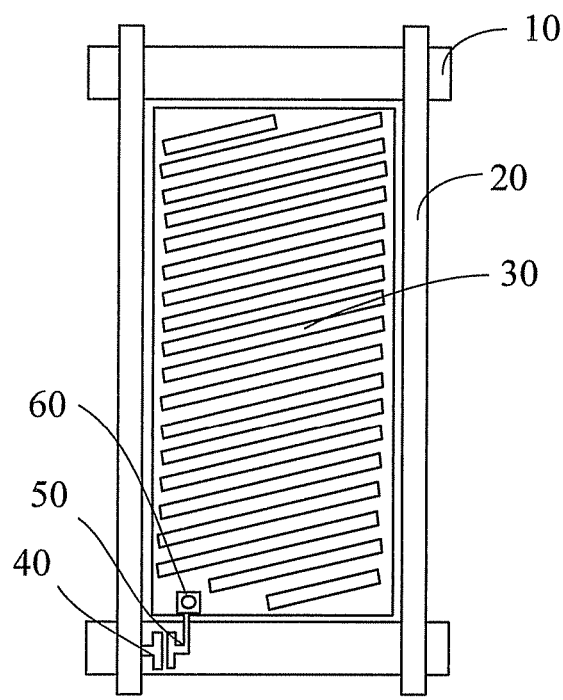
FIG. 1 is an illustrative structure view of a pixel unit in a prior art.

1—substrate; 10, 11—gate line; 20, 21—data line; 30—pixel electrode; 31—active area pixel electrode; 32—passive area pixel electrode; 40, 41—source electrode; 50, 51—drain electrode; 60, 61, 62—via; 70—coupling electrode.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

The structure of the TFT array substrate of the liquid crystal display in the prior art limits the deflection angle of the liquid crystal molecules under the drive voltage, that is, the liquid crystal molecules have only the same deflection angle. Since the liquid crystal molecules are anisotropic, the brightness of the liquid crystal display is different from different visual angles. That is, a chromatic aberration is occurred when the liquid crystal display displays a picture, decreasing the quality of the picture displayed on the liquid crystal display.

Accordingly, the present invention in certain embodiments provides a pixel unit, a TFT array substrate and a liquid crystal display. Each of the pixel units comprising: an active area pixel electrode and a passive area pixel electrode both disposed in a first layer; a thin film transistor switch electrically connected to the active area pixel electrode; and a coupling electrode disposed in a second layer from the first layer and electrically connected to the active area pixel electrode, wherein the coupling electrode and the passive area pixel electrode are arranged to be at least partly overlapped with each other to form a coupling capacitance. When the liquid crystal display with the above mentioned pixel unit and the TFT array substrate is in operation, the liquid crystal molecules have at least two different deflection angles, alleviating the chromatic aberration of a picture displayed on the liquid crystal display and improving the quality of the picture displayed on the liquid crystal display.

Hereafter, it will describe in detail exemplary embodiments of the present invention with reference to the accompanying drawings so that those skilled in this art can understand the present invention well.

Figure 2:
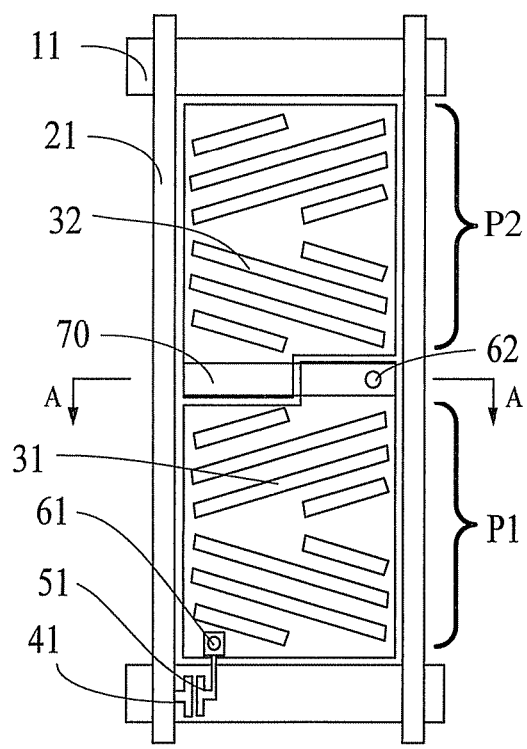
FIG. 2 is an illustrative structure view of a pixel unit according to an exemplary embodiment of the present invention.
Figure 3:
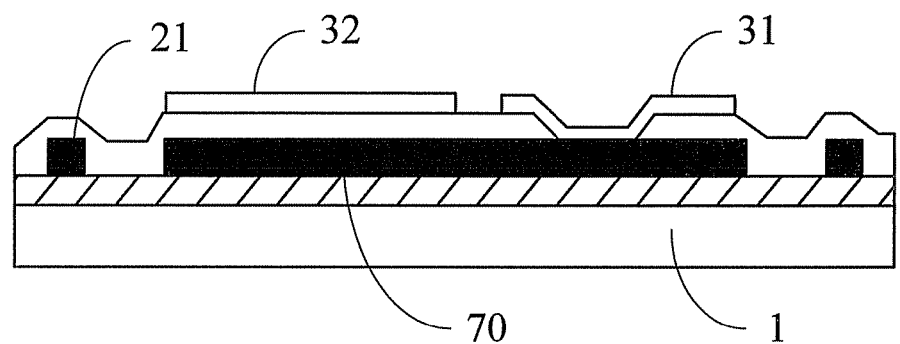
FIG. 3 is a cross section view of the pixel unit taken in a line A-A of FIG. 2.

As shown in FIGS. 2-3, a pixel unit is provided according to an exemplary embodiment of the present invention. The pixel unit mainly comprising: an active area pixel electrode 31 and a passive area pixel electrode 32 both disposed in a first layer; a thin film transistor switch electrically connected to the active area pixel electrode 31; and a coupling electrode 70 disposed in a second layer from the first layer and electrically connected to the active area pixel electrode 31, wherein the coupling electrode 70 and the passive area pixel electrode 32 are arranged to be at least partly overlapped with each other to form a coupling capacitance Cc.

Furthermore, in the pixel unit of the embodiment, the pixel electrode is divided into two areas including an active area P1 and a passive area P2. The active area P1 is electrically isolated from the passive area P2. The active area pixel electrodes 31 are arranged in the active area P1 and electrically connected to the TFT switch through a via 61. Particularly, the active area pixel electrodes 31 are electrically connected to a source electrode 41 or a drain electrode 51 of the TFT. In addition, the active area pixel electrodes 31 are further electrically connected to the coupling electrode 70 through a via 62. The passive pixel electrodes 32 are arranged in the passive area P2 and at least partly overlapped with the coupling electrode 70 to form the coupling capacitance Cc together with the coupling electrode 70.

The operational principle of the above mentioned pixel units arranged on the TFT array substrate in an array will be described in detail as follows.

Figure 4:
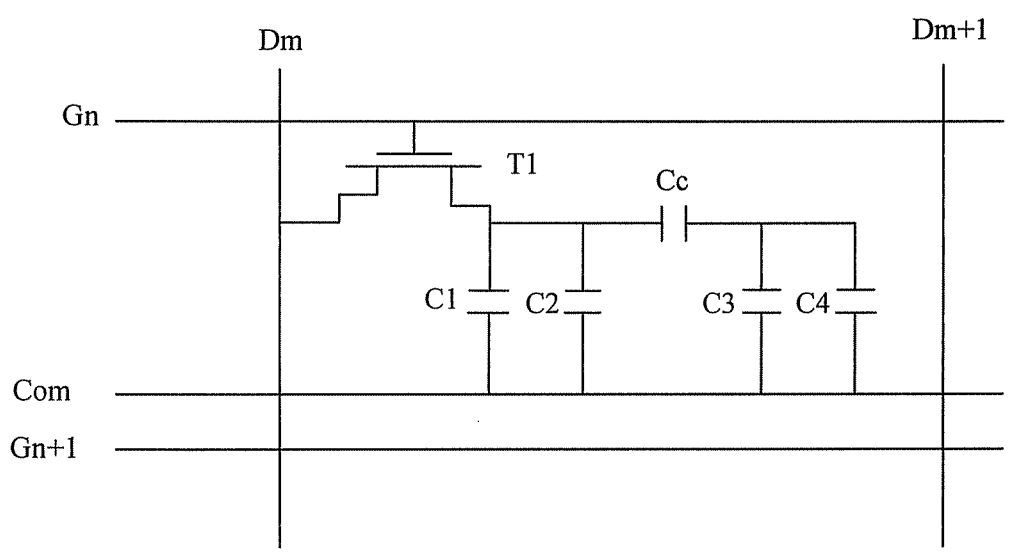
FIG. 4 is an equivalent circuit diagram for driving a pixel unit according to an exemplary embodiment of the present invention.

As shown in FIG. 4, when the TFT is turned on by a gate line Gn at the $n^{th}$ row, a data voltage of the data line Dm at the $m^{th}$ column charges the active area pixel electrode 31 through a thin film transistor T1, that is, a drive voltage of the active area pixel electrode 31 is provided by the TFT. The active area pixel electrode 31 and a common electrode on the TFT array substrate form a liquid crystal capacitance C1 and a storage capacitance C2. The liquid crystal capacitance C1 controls the revolution of liquid crystal molecules corresponding to the active area pixel electrode 31, and the storage capacitance C2 maintains the liquid crystal molecules at a certain deflection angle. The passive area pixel electrode 32 and the coupling electrode 70 together form the coupling capacitance. Upon a voltage is applied on the active area pixel electrode 31, the coupling electrode 70 obtains a voltage because the coupling electrode 70 is electrically connected to the active area pixel electrode 31. The passive area pixel electrode 32 obtains a drive voltage through the coupling capacitance Cc. The passive area pixel electrode 32 and the common electrode form a liquid crystal capacitance C3 and a storage capacitance C4. The liquid crystal capacitance C3 controls the revolution of liquid crystal molecules corresponding to the passive area pixel electrode 32, and the storage capacitance C4 maintains the liquid crystal molecules at a certain deflection angle. Please be noted that the voltage of the passive area pixel electrode 32 is obtained through the coupling capacitance Cc. As a result, the voltage applied on the passive area pixel electrode 32 is deferred with respect to the voltage applied on the active area pixel electrode 31 by a predetermined time. The voltage of the active area P1 and the voltage of the passive area P2 may be adjusted to be different from each other by changing the coupling capacitance, that is, the voltage applied on the passive area pixel electrode 32 can be changed by changing the area of the passive area pixel electrode 32 overlapped with the coupling electrode 70, so that the voltage applied on the active area pixel electrode 31 and the voltage applied on the passive area pixel electrode 32 become different each other, and that the liquid crystal molecules in each of the pixel units have two different deflection angles.

Accordingly, when the above mentioned TFT array substrate is applied to the liquid crystal display of the present invention, the liquid crystal molecules filled in the liquid crystal display have two different deflection angles. As a result, the brightness difference of the liquid crystal display at different visual angles is reduced due to an even effect of the liquid crystal orientation. Thereby, compared with the prior art, the liquid crystal display of the present invention alleviates the chromatic aberration of a picture displayed on the liquid crystal display and improves the quality of the picture displayed on the liquid crystal display.

Please refer to FIG. 2 again, in order to further alleviate the chromatic aberration of the picture displayed on the liquid crystal display, in the above mentioned pixel unit, the active area pixel electrode 31 and the passive area pixel electrode 32 each comprises a set of slit electrodes symmetrically arranged. More specifically, an electrode pattern in each of the active area P1 and the passive area P2 is divided into two portions symmetrically arranged. The active area pixel electrode 31 comprises a set of slit electrodes that are symmetrically arranged and have a certain inclination angle. The passive area pixel electrode 32 comprises a set of slit electrodes that are symmetrically arranged and have a certain inclination angle. When a voltage is applied on the active area pixel electrode 31, the liquid crystal molecules corresponding to the active area pixel electrode 31 have two different deflection angles, and the liquid crystal molecules corresponding to the passive area pixel electrode 32 also have two different deflection angles. Because the voltage applied on the passive area pixel electrode 32 is different from that applied on the active area pixel electrode 31 and deferred than the active area pixel electrode 31 by the predetermined time, the liquid crystal molecules corresponding to each of the pixel units have four different deflection angles, so that the anisotropy of the liquid crystal molecules is further evened, further alleviating the chromatic aberration of the picture displayed on the liquid crystal display and further improving the quality of the picture displayed on the liquid crystal display.

Each of the slit electrodes of the active area pixel electrode 31 and the passive area pixel electrode 32 has a certain inclination angle. Such inclination angle may be simulated based on the pixel design and the selected liquid crystal molecules. When the liquid crystal molecules corresponding to each of the pixel units are positive liquid crystal molecules, in the above mentioned pixel unit, an angle between an orientation of the slit electrode and an initial orientation of a liquid crystal molecules is in a range of 5 degrees to 20 degrees. In other words, when the angle between an extending direction of the slit electrodes of the active area pixel electrode 31 and the passive area pixel electrode 32 and the initial orientation of the liquid crystal molecules is in the range of 5 degrees to 20 degrees, only the positive liquid crystal molecules can be applied in the liquid crystal display. The initial orientation of the liquid crystal molecules depends on an orientation layer, and the detailed description thereof is omitted herein because it is well known for those skilled in this art.

Similarly, when the liquid crystal molecules corresponding to each of the pixel units are negative liquid crystal molecules, in the above mentioned pixel unit, an angle between an orientation of the slit electrode and an initial orientation of a liquid crystal is in a range of 70 degrees to 85 degrees.

Each of the above pixel units comprises an active area pixel electrode 31 and a passive area pixel electrode 32. An area of an electrode pattern of the active area pixel electrode 31 and an area of an electrode pattern of the passive area pixel electrode 32 can be various as long as it satisfies the coupling principle of FIG. 4, that is, a coupling capacitance can be generated between the coupling electrode 70 and the passive area pixel electrode 32. Furthermore, in the above pixel unit, a ratio of the area of the electrode pattern of the active area pixel electrode 31 to the area of the electrode pattern of the passive area pixel electrode 32 is in a range of 1:1 to 1:9.

As shown in FIG. 2, in the above mentioned pixel unit, the electrode pattern of the active area pixel electrode 31 is identical with the electrode pattern of the passive area pixel electrode 32.

The present also provides a thin film transistor array substrate, comprising: a substrate; and the above mentioned pixel units arranged on the substrate in an array.

Furthermore, in order to save the space and facilitate the manufacture, the coupling electrode 70 in the pixel unit and a gate line or a data line on the substrate 1 are disposed in the same layer. That is, the coupling electrode 70 and the gate line or the data line are manufactured at the same time, the process of manufacturing the coupling electrode 70 is the same as the process of manufacturing the gate line or the data line, and the description thereof is omitted herein.

Although it is not shown, it would be appreciated by those skilled in the art that the above array substrate may further comprise gate lines, data lines and a common electrode formed on the substrate, and a first pixel electrode layer and a second pixel electrode layer located above the first pixel electrode layer and separated from the first pixel electrode layer by an insulation layer. The gate lines and the data lines cross with each other to define sub pixel units, and each of the sub pixel units comprises a thin film transistor. One of the first and second pixel electrode layers is connected to a source electrode of the thin film transistor, and the other is connected to the common electrode. The second pixel electrode layer comprises the active area pixel electrode and the passive area pixel electrode which are disposed in the same layer and electrically isolates from each other.

Embodiments of the present invention also provide a liquid crystal display comprising the above mentioned thin film transistor array substrate. When the liquid crystal display is in operation, in each of the pixel units, the drive voltage of the active area pixel electrode 31 is provided by the TFT, and an electric field is generated between the active area pixel electrode 31 and the common electrode on the TFT array substrate to drive the corresponding liquid crystal molecules to deflect. Upon the drive voltage is applied on the active area pixel electrode 31, the coupling electrode 70 electrically connected to the active area pixel electrode 31 obtains a voltage, and the voltage is applied on the passive area pixel electrode 32 through a coupling capacitance Cc formed by the coupling electrode 70 and the passive area pixel electrode 32. Then, an electric field is generated between the passive area pixel electrode 32 and the common electrode on the TFT array substrate to drive the corresponding liquid crystal molecules to deflect.

Since the voltage applied on the passive area pixel electrode 32 is generated by the coupling capacitance, the voltage applied on the passive area pixel electrode 32 is deferred with respect to the voltage applied on the active area pixel electrode 31 by the predetermined time. As a result, the liquid crystal molecules corresponding to each of the pixel units have two different deflection angles. That is, the liquid crystal molecules in the liquid crystal display have at least two different deflection angles. Thereby, the brightness difference of the liquid crystal display at different visual angles is reduced due to an even effect of the liquid crystal orientation. Therefore, compared with the prior art, the present invention alleviates the chromatic aberration of a picture displayed on the liquid crystal display and improves the quality of the picture displayed on the liquid crystal display.

In sum, when the liquid crystal display adopting the pixel unit and the TFT array substrate of the present invention is in operation, the liquid crystal molecules filled in the liquid crystal display have at least two different deflection angles. As a result, the brightness difference of the liquid crystal display at different visual angles is reduced due to an even effect of the liquid crystal orientation. Thereby, compared with the prior art, the present invention alleviates the chromatic aberration of a picture displayed on the liquid crystal display and improves the quality of the picture displayed on the liquid crystal display.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A pixel unit, comprising:
   an active area pixel electrode and a passive area pixel electrode both disposed in a first layer;
   a thin film transistor switch electrically connected to the active area pixel electrode; and
   a coupling electrode disposed in a second layer different from the first layer and electrically connected to the active area pixel electrode,
   wherein the coupling electrode and the passive area pixel electrode are arranged to be partly overlapped with each other to form a coupling capacitance,
   wherein the coupling electrode has a rectangular shape, the active area pixel electrode is partly overlapped with the coupling electrode, the coupling electrode is electrically connected to the active area pixel electrode directly by a single via located in a region where the active area pixel electrode is overlapped with the coupling electrode, and the length direction of the coupling electrode is parallel to an extending direction of a gate line;
   wherein the active area pixel electrode and the passive area pixel electrode each comprises a set of slits symmetrically arranged, and
   wherein the coupling electrode does not overlap with any slits in both the active area pixel electrode and the passive area pixel electrode.

2. The pixel unit according to claim 1, wherein an angle between an orientation of one or more slits and an initial orientation of a liquid crystal molecule is in a range of 5 degrees to 20 degrees.

3. The pixel unit according to claim 1, wherein an angle between an orientation of one or more slits and an initial orientation of a liquid crystal molecule is in a range of 70 degrees to 85 degrees.

4. The pixel unit according to claim 1, wherein a ratio of an area of an electrode pattern of the active area pixel electrode to an area of an electrode pattern of the passive area pixel electrode is in a range of 1:1 to 1:9.

5. The pixel unit according to claim 2, wherein a ratio of an area of an electrode pattern of the active area pixel electrode to an area of an electrode pattern of the passive area pixel electrode is in a range of 1:1 to 1:9.

6. The pixel unit according to claim 3, wherein a ratio of an area of an electrode pattern of the active area pixel electrode to an area of an electrode pattern of the passive area pixel electrode is in a range of 1:1 to 1:9.

7. The pixel unit according to claim 4, wherein the electrode pattern of the active area pixel electrode is identical with that of the passive area pixel electrode.

8. An array substrate, comprising:
   a substrate; and
   pixel units according to claim 1 arranged on the substrate in an array.

9. The array substrate according to claim 8, wherein the coupling electrode in the pixel unit and the gate line or a data line on the substrate are disposed in the same layer.

10. A liquid crystal display, comprising the array substrate according to claim 8.

* * * * *